(12) United States Patent
Campbell et al.

(10) Patent No.: US 11,132,036 B2
(45) Date of Patent: Sep. 28, 2021

(54) IMPLEMENTING ENHANCED COMPONENT RELIABILITY USING AIR FLOW CONTROL

(71) Applicant: International Business Machines Corporation, Armonk, NY (US)

(72) Inventors: Eric J. Campbell, Rochester, MN (US); Cody J. Erie, Adams, MN (US); Tyler Jandt, Rochester, MN (US); Brandon R. Christenson, Stewartville, MN (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 15/950,007

(22) Filed: Apr. 10, 2018

(65) Prior Publication Data
US 2019/0310696 A1 Oct. 10, 2019

(51) Int. Cl.
G06F 1/20 (2006.01)
G05B 15/02 (2006.01)
H05K 5/02 (2006.01)
H05K 7/20 (2006.01)

(52) U.S. Cl.
CPC ............ G06F 1/206 (2013.01); G05B 15/02 (2013.01); H05K 5/0213 (2013.01); H05K 7/20181 (2013.01); H05K 7/20618 (2013.01)

(58) Field of Classification Search
CPC .... G06F 1/206; G05B 15/02; H05K 7/20181; H05K 7/20618; H05K 5/0213
USPC ...................................................... 700/282
See application file for complete search history.

(56) References Cited

U.S. PATENT DOCUMENTS

| | | | |
|---|---|---|---|
| 4,304,070 A * | 12/1981 | Musacchia | A62C 2/12 49/13 |
| 5,465,607 A * | 11/1995 | Corrigan | G01N 1/2214 250/282 |
| 8,411,437 B2 | 4/2013 | Shu | |
| 8,634,190 B2 | 1/2014 | Nguyen | |
| 2007/0017667 A1* | 1/2007 | Weng | F24F 1/00075 165/214 |
| 2010/0328886 A1 | 12/2010 | Nguyen | |
| 2011/0250050 A1 | 10/2011 | Nguyen | |
| 2012/0127664 A1 | 5/2012 | Shu | |
| 2013/0118353 A1 | 5/2013 | Iyengar et al. | |
| 2014/0055951 A1 | 2/2014 | Jin et al. | |
| 2014/0177168 A1 | 6/2014 | Scott et al. | |
| 2014/0340224 A1* | 11/2014 | Tan | G06F 1/20 340/540 |
| 2015/0354874 A1* | 12/2015 | Cur | F24F 3/1603 62/216 |

(Continued)

FOREIGN PATENT DOCUMENTS

| | | | |
|---|---|---|---|
| CN | 204859807 U | * | 12/2015 |
| CN | 207588230 U | * | 7/2018 |
| CN | 207589345 U | * | 7/2018 |

*Primary Examiner* — Emilio J Saavedra
(74) *Attorney, Agent, or Firm* — Jorge R. Maranto

(57) ABSTRACT

A method, system and computer program product for implementing enhanced component reliability for leading edge components in a server computer system based upon system humidity conditions. A humidity value is identified and compared with a threshold value at an air flow input in contact with the leading edge components. One or more air flow control elements are used to direct air flow based upon the compared humidity values of the server system.

19 Claims, 5 Drawing Sheets

(56) References Cited

U.S. PATENT DOCUMENTS

2017/0099746 A1 4/2017 Rubenstein
2018/0217644 A1* 8/2018 Dan ....................... G06F 1/206

* cited by examiner

US 11,132,036 B2

IMPLEMENTING ENHANCED COMPONENT RELIABILITY USING AIR FLOW CONTROL

FIELD OF THE INVENTION

The present invention relates generally to the data processing field, and more particularly, relates to a method, system and computer program product for implementing enhanced component reliability for leading edge components in a server computer system using air flow control based upon system humidity conditions.

DESCRIPTION OF THE RELATED ART

Traditional thermal management in a server computer system is designed to cool down components of three major subsystems including the processor, memory and Input Output (IO). Methods have been developed to increase the amount of air flow to cool down one or more components rapidly, if needed.

Whenever computer system components, such as processors, buffers, DIMM modules, and the like of a server system get hotter, the thermal management device employs several mechanisms to reduce or bring down the temperature. One widely adopted technique is to ramp the speed of fans to their fullest speed, so that the increased air flow helps in reducing the temperature of the hotter modules.

A need exists for an efficient and effective mechanism for implementing enhanced component reliability for leading edge components in a server computer system based upon system humidity conditions and deliquescent dust values.

SUMMARY OF THE INVENTION

Principal aspects of the present invention are to provide a method, system and computer program product for implementing enhanced component reliability for leading edge components in a server computer system based upon system humidity conditions. Other important aspects of the present invention are to provide such method, system and computer program product substantially without negative effects and that overcome many of the disadvantages of prior art arrangements.

In brief, a method, system and computer program product for implementing enhanced component reliability for sensitive leading edge components in a server computer system based upon system humidity conditions. A humidity value is identified and compared with a threshold value at an air flow input in contact with the sensitive leading edge components. One or more air flow control elements are used to direct air flow based upon the compared humidity values of the server system.

In accordance with features of the invention, the leading edge components of the server system include corrosion sensitive components located at a front, leading edge of the server system.

In accordance with features of the invention, one or more baffles are selectively positioned to control air flow. The one or more baffles are positioned to direct air flow away from the leading edge components to actively increase the temperature of the leading edge components when humidity values are above a predefined threshold. In typical operation the baffles are positioned enabling air flow to cool active components.

In accordance with features of the invention, a filter is selectively operated to control air flow. The filter is operated to effectively close to direct air flow away from the leading edge components to actively block dust from further entering the server and the leading edge components when humidity values are above a predefined threshold value. In typical operation the filter is open enabling air flow to cool active components.

In accordance with features of the invention, a sensor senses when humidity value surrounding sensitive components passes a humidity threshold value.

In accordance with features of the invention, a dust level is identified and compared with a dust threshold value at an air flow input in contact with the leading edge components. One or more air flow control elements are used to direct air flow based upon the compared dust values of the server system.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and system are provided for implementing enhanced component reliability in a computer system.

Figure 1:
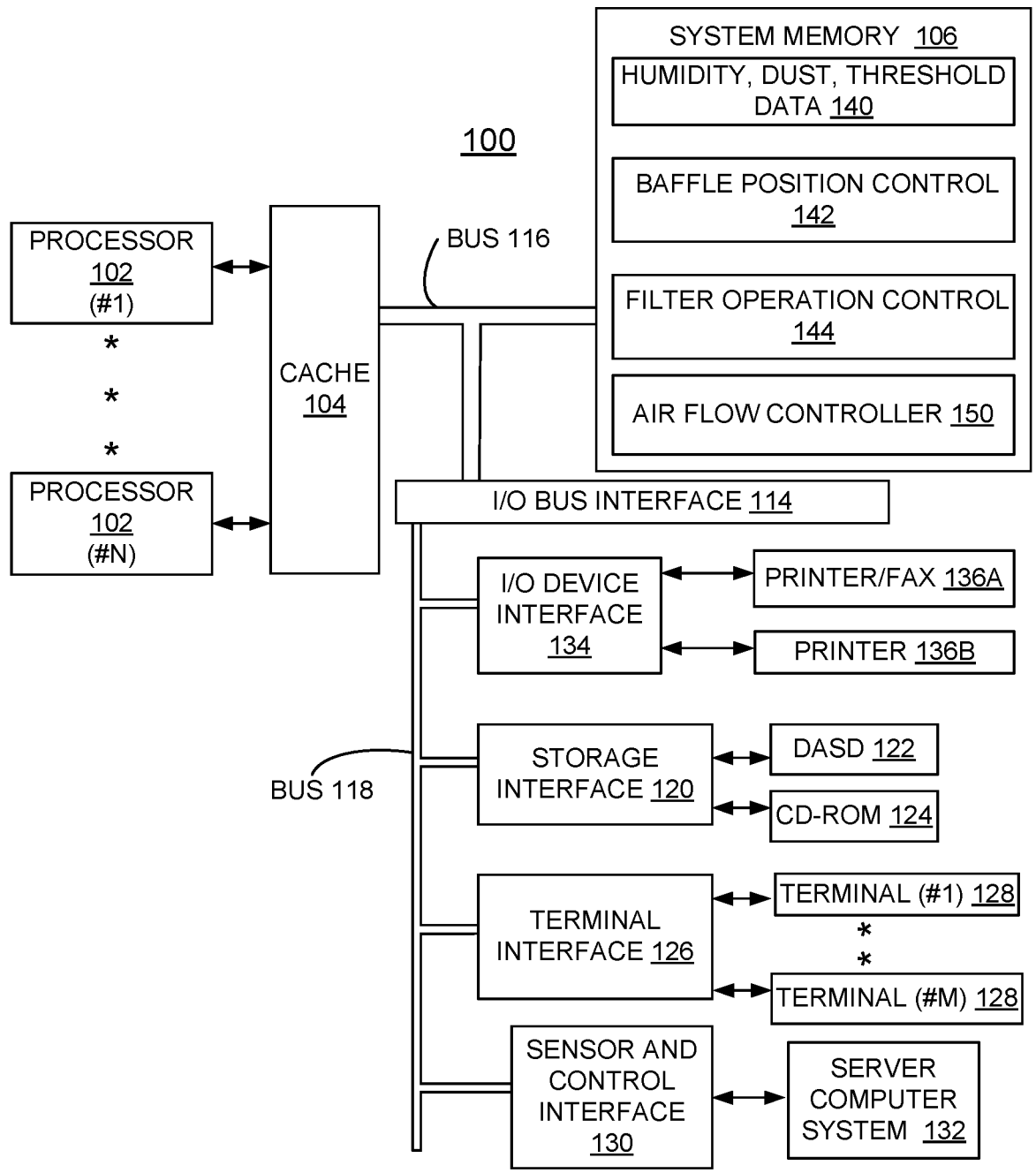
FIG. 1 is a block diagram of an example computer system for implementing enhanced component reliability for leading edge components in a server computer system based upon system humidity conditions in accordance with preferred embodiments.

Having reference now to the drawings, in FIG. 1, there is shown a computer system embodying the present invention generally designated by the reference character 100 for implementing enhanced component reliability based upon system humidity conditions for sensitive components, for example, for leading edge components in a server computer system in accordance with preferred embodiments. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a system memory 106. System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, system memory 106 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a sensor and control interface 130 connected to a separate server computer system 132 in accordance with preferred embodiments, and a I/O device interface 134 coupled to I/O devices, such as a first printer/fax 136A, and a second printer 136B.

I/O bus interface 114 communicates with multiple I/O interface units 120, 126, 130, and 134, which are also known as I/O processors (IOPs) or I/O adapters (IOAs), through system I/O bus 116. System I/O bus 116 is, for example, an industry standard PCI bus, or other appropriate bus technology.

Figure 3A:
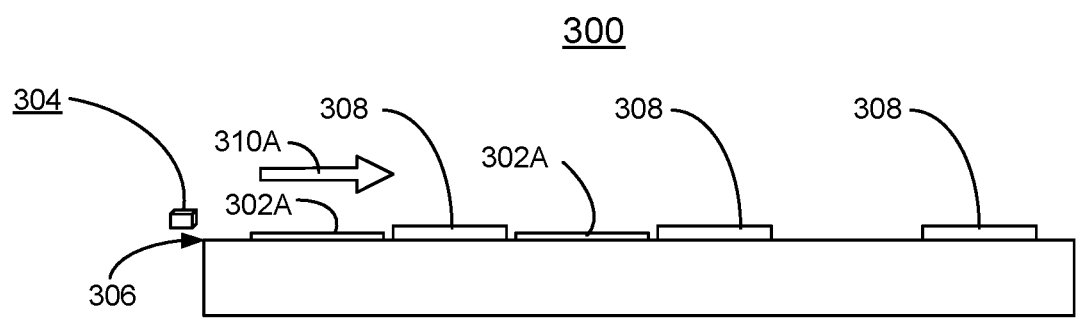
FIGS. 3A and 3B schematically illustrate not to scale an example hardware system and operations used for implementing enhanced component reliability in accordance with preferred embodiments.
Figure 3B:
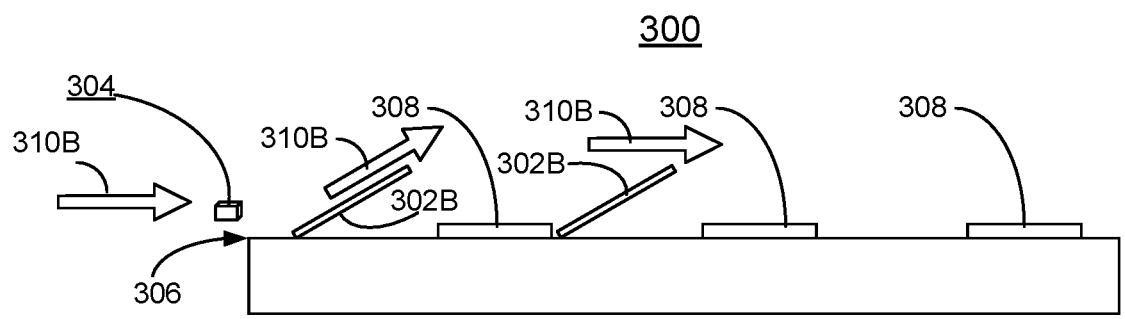
Figure 4A:
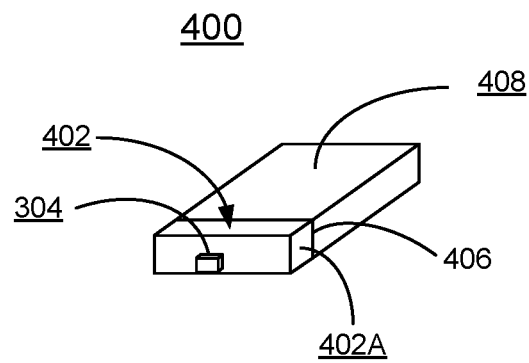
FIGS. 4A and 4B schematically illustrate not to scale another example hardware system and operations used for implementing enhanced component reliability in accordance with preferred embodiments.
Figure 4B:
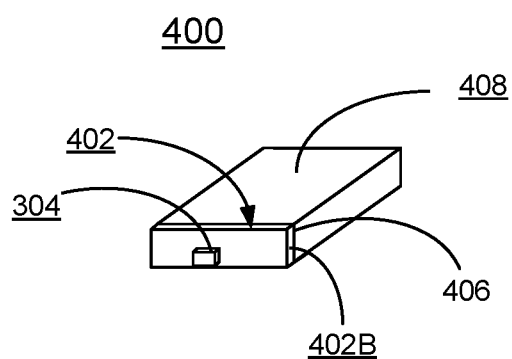

System memory 106 stores humidity, dust, threshold data 140 for implementing enhanced component reliability for sensitive components, for example, for leading edge sensitive components in a server computer system 132, a baffle position control 142, a filter operation control 144 and an air flow controller 150 for controlling air flow such as illustrated and described with respect to FIGS. 3A and 3B, and such as illustrated and described with respect to FIGS. 4A and 4B in accordance with the preferred embodiments.

Figure 2:
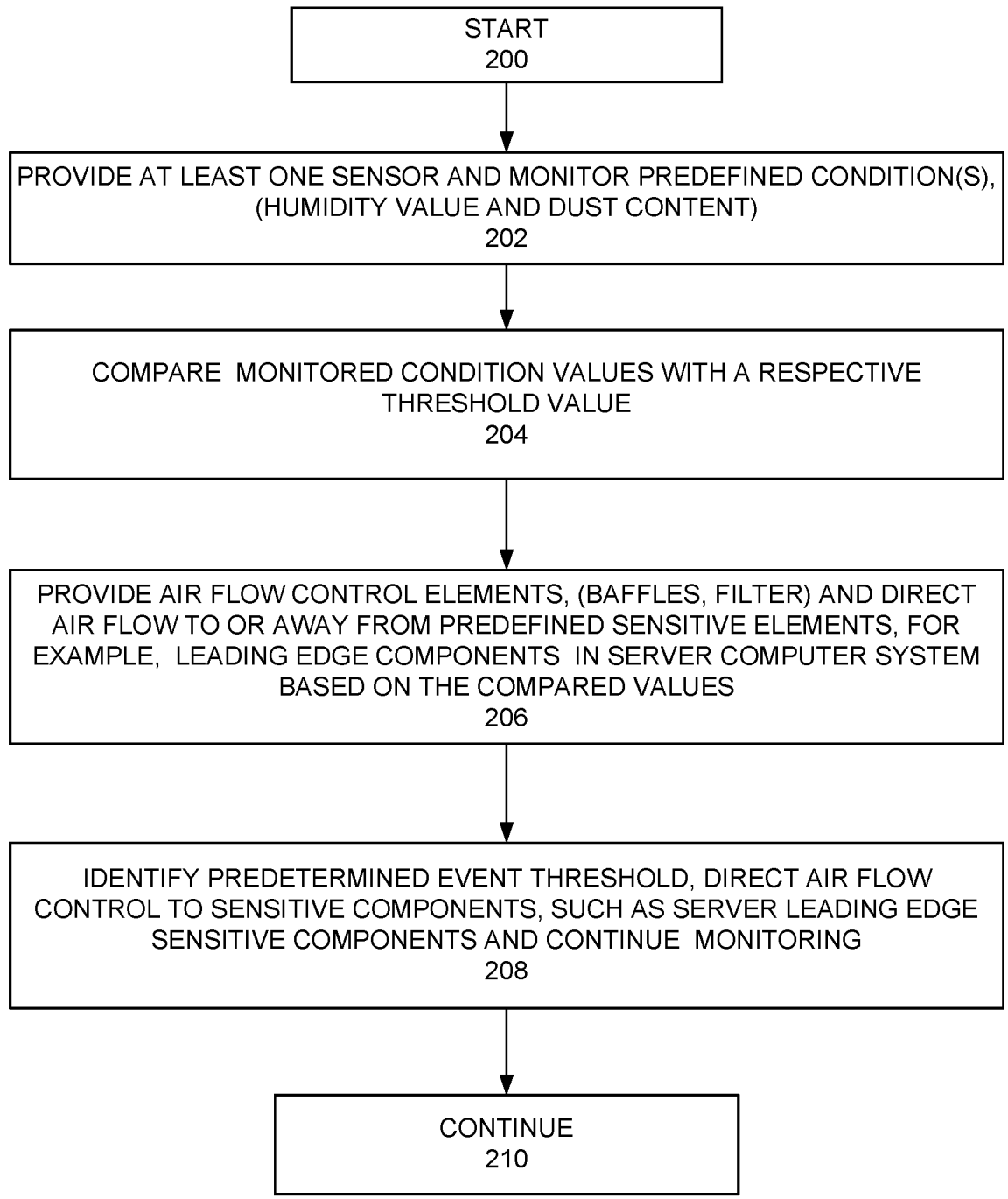
FIG. 2 is a flow chart illustrating example system operations of the computer system of FIG. 1 for implementing enhanced component reliability in accordance with preferred embodiments.

Referring to FIG. 2, there are shown example system operations of hardware system 300 of FIGS. 3A and 3B, of hardware system 400 of FIGS. 4A and 4B, and of the computer system 100 of FIG. 1 for implementing thermal air flow control management in accordance with preferred embodiments starting at a block 200. As indicated in a block 202, one or more sensors are provided and one or more predefined conditions are monitored, such as humidity value detected by a humidity sensor, and dust deliquescence value and/or leakage current value detected by the dust sensor. As indicated in a block 204, the monitored condition values are compared with a respective stored threshold value. As indicated in a block 206, one or more air flow control elements, such as baffles or vanes, and filters are provided and air flow is directed to or away from sensitive components, for example, leading edge components in the server computer system based upon the compared values. For example, the air flow control elements, such as baffles or vanes, and filters direct air flow away from the sensitive components when the monitored value exceeds the respective threshold value causing the temperature to increase around the sensitive components.

As indicated in a block 208, when a predetermined event threshold is identified, air flow control is directed to the sensitive components or leading edge sensitive components in the server computer system, for example, when the humidity or dust level has decreased below a respective stored threshold value for cooling and monitoring is continued. Operations continue as indicated in a block 210.

Referring now to FIGS. 3A and 3B, there are schematically shown not to scale example hardware system and operations generally designated by the reference character 300 used for implementing enhanced component reliability in accordance with preferred embodiments. Hardware system 300 includes a plurality of air flow control elements 302A, such as baffles or vanes 302A, and a sensor 304 positioned near an air flow inlet 306 to one or more sensitive components 308, for monitoring one or more predefined conditions, such as humidity value and dust content.

In accordance with features of the invention, system 300 is configured for keeping humidity below a specified percent humidity in the server computer system. High humidity can accelerate corrosion on circuit elements. Vanes or baffles are incorporated into the front of the server such that when activated, the baffles direct airflow away from leading edge components, thereby causing temperature of air surrounding the corrosion sensitive component to rise, the elevated temperature resulting in lower humidity in the air surrounding the corrosion sensitive component 308, providing enhanced component reliability.

In FIG. 3A, an air flow indicated by arrow 310A is directed by the air flow control elements 302A, such as baffles or vanes 302A, for cooling the sensitive components 308 or leading edge sensitive components 308 in the server computer system, for example, when the humidity or dust level is below a respective stored threshold value.

In FIG. 3B, an air flow indicated by arrows 310B is directed by the air flow control elements 302B, such as baffles or vanes 302B, away from the sensitive components 308 or leading edge sensitive components 308 in the server computer system, for example, when the humidity or dust level is above a respective stored threshold value. Directing airflow 306B away from the components 308 causes the surrounding air to increase in temperature. As the temperature increases, the relative humidity decreases. Decreasing the humidity in the air will prevent deliquescent corrosion due to dust accumulation. The air flow control elements 302B, baffles or vanes 302B advantageously are actuated by the sensor 304 to direct airflow away from the sensitive components 308 responsive to the monitored value greater than the threshold value. The air flow control elements 302B, baffles or vanes 302B alternatively are controlled by the air flow controller 150 (shown in FIG. 1) responsive to at least one sensor 304 positioned near a front 306 of the server computer system 132. By diverting airflow away from the components 308, causes the surrounding air to increase in temperature and decrease in relative humidity.

Referring now to FIGS. 4A and 4B, there are schematically shown not to scale another example hardware system and operations generally designated by the reference character 400 used for implementing enhanced component reliability in accordance with preferred embodiments. Example hardware system 400 includes, for example, sensor 304 positioned near an air flow inlet 406 to one or more sensitive components within a server or rack 408. Sensor 304 monitors one or more predefined conditions, such as humidity value and dust content in accordance with preferred embodiments. Hardware system 400 includes an active filter generally designated by reference character 402 that is incorporated into the rack door or server bezel at the air flow inlet 406. The active filter 402 is implemented, for example, by multiple filter slats that can rotate into an open or closed position, or other movable or expandable filter arrangement.

In FIG. 4A, the filter 402 is shown in a normally OFF position 402A, where it is not filtering the incoming airflow. In filter OFF position 402A, the filter 402 normally is in the open state, which does not filter incoming air.

In FIG. 4B, during specified conditions, such as high humidity or high dust content, the filter 402 moves to a closed or ON position 402B and begins filtering the incoming airflow to eliminate any additional dust from entering the system. Active filtering is beneficial because it reduces the thermal and acoustic impact when the filter 402 is in the open state.

Figure 5:
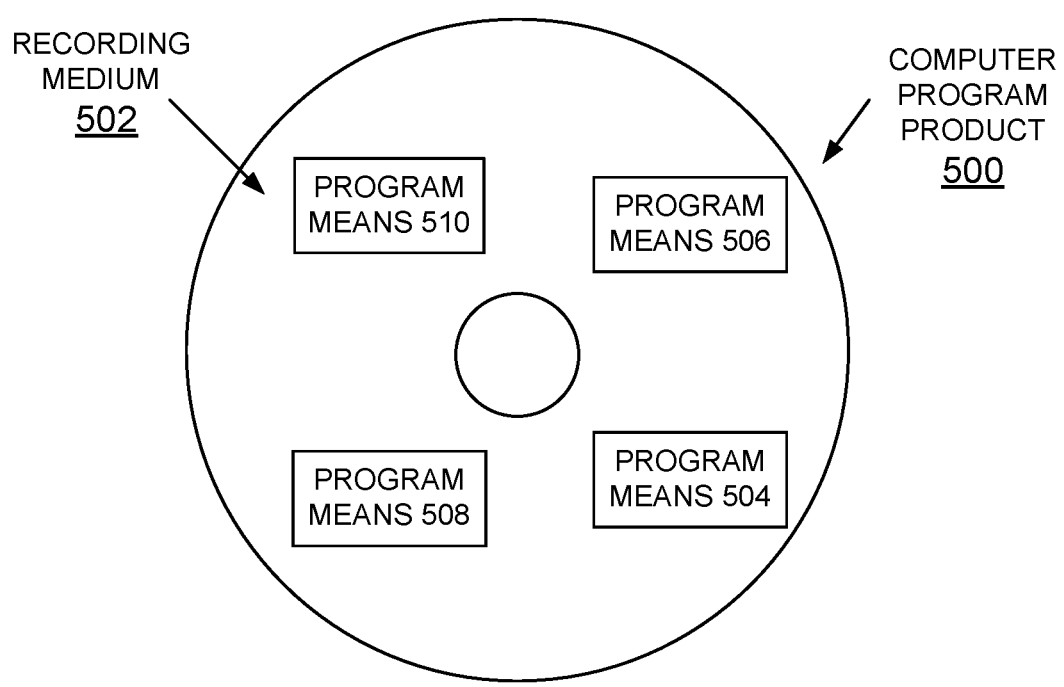
FIG. 5 is a block diagram illustrating a computer program product in accordance with the preferred embodiment.

Referring now to FIG. 5, an article of manufacture or a computer program product 500 of the invention is illustrated. The computer program product 500 is tangibly embodied on a non-transitory computer readable storage medium that includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for implementing enhanced component reliability of the preferred embodiment in the system 100 of FIG. 1.

A sequence of program instructions or a logical assembly of one or more interrelated modules defined by the recorded program means 504, 506, 508, and 510, direct the system 100 for implementing enhanced component reliability of the preferred embodiment.

While the present invention has been described with reference to the details of the embodiments of the invention shown in the drawing, these details are not intended to limit the scope of the invention as claimed in the appended claims.

What is claimed is:

1. A system for implementing enhanced component reliability for leading edge components of a server computer system comprising:
a processor,
a controller tangibly embodied in a computer readable storage medium used to implement enhanced component reliability;
the processor using the controller, identifying humidity values at an air flow input of the server computer system including sensitive components; and
the processor using the controller, providing active filter air flow control elements changing positions and directing air flow by providing one or more baffles selectively changing position based upon the identified humidity values of the server computer system to direct air flow away from the sensitive components and elevating a temperature of air around the sensitive components, thereby lowering the identified humidity values.

2. The system as recited in claim 1 includes the processor using the controller, comparing the identified humidity value with a threshold value, and responsive to the identified humidity value greater than the stored threshold value, directing the air flow away from the sensitive components.

3. The system as recited in claim 1 identifying a dust level value, and comparing the identified dust level value with a threshold value, directing air flow away from the sensitive components responsive to the identified dust level value greater than the stored threshold value.

4. The system as recited in claim 1 includes the processor using the controller storing one or more threshold values.

5. The system as recited in claim 1 wherein the processor using the controller providing active filter air flow control elements changing positions and directing air flow includes providing an active filter selectively changing operation based upon the identified humidity and dust content value.

6. The system as recited in claim 1 includes the processor using the controller providing predefined air flow to cool the sensitive components before a predetermined threshold is reached.

7. The system as recited in claim 1 includes control code stored on a non-transitory computer readable medium, and wherein the processor and the controller use the control code for implementing enhanced component reliability.

8. A system for implementing enhanced component reliability for sensitive leading-edge components of a server computer system comprising:
a sensor for identifying humidity value of an air flow to the sensitive components; and
active filter air flow control elements changing positions and directing air flow away from the sensitive components responsive to the identified humidity value greater than a threshold value, the active filter air flow control elements further include providing one or more baffles selectively changing position based upon the identified humidity value of the server computer system to direct air flow away from the sensitive components and elevating a temperature of air around the sensitive components thereby lowering the identified humidity value.

9. The system as recited in claim 8 wherein the active filter air flow control elements providing predefined air flow to cool the sensitive components before a predetermined threshold is reached.

10. The system as recited in claim 8 wherein the active filter air flow control elements are actuated by the sensor.

11. A computer-implemented method for implementing enhanced component reliability for sensitive leading edge components of a server computer system comprising:
identifying a humidity value in contact with the sensitive leading edge components of the server computer system;
providing active filter air flow control elements changing positions and directing air flow by selectively changing position of one or more baffles based upon the identified humidity values of the server computer system; and
elevating a temperature of air around the sensitive leading edge components, thereby lowering the identified humidity values.

12. The computer-implemented method as recited in claim 11 includes comparing the identified humidity value with a stored threshold value, and responsive to the identified humidity value greater than the stored threshold value, directing air flow away from the sensitive components.

13. The computer-implemented method as recited in claim 11 includes identifying a dust level value in contact with the sensitive leading edge components of the server computer system.

14. The computer-implemented method as recited in claim 13 includes comparing the identified dust level value with a stored threshold value, and responsive to the identified dust level value greater than the stored threshold value, directing air flow away from the sensitive components.

15. The computer-implemented method as recited in claim 11 includes providing active filter baffles selectively changing position based upon the identified humidity value, the active filter baffles, responsive to the identified humidity value greater than the stored threshold value, directing air flow away from the sensitive components.

16. The computer-implemented method as recited in claim 11 providing the active filter selectively changing operation based upon the identified humidity value, the active filter responsive to the identified humidity value greater than the stored threshold value, preventing additional dust accumulation to the sensitive components.

17. The computer-implemented method as recited in claim 11 includes providing predefined air flow to cool the sensitive components before a predetermined threshold is reached.

18. The computer-implemented method as recited in claim 11 includes providing a processor, and a controller tangibly embodied in a non-transitory machine readable medium used to implement enhanced component reliability.

19. The computer-implemented method as recited in claim 18 includes providing control code stored on a non-transitory computer readable medium, and wherein the processor and the controller use the control code for implementing enhanced component reliability.

* * * * *